US012677668B2

(12) United States Patent
Wu et al.

(10) Patent No.:  US 12,677,668 B2
(45) Date of Patent:  Jul. 7, 2026

(54) ELECTRONIC DEVICE

(71) Applicant: Advanced Semiconductor Engineering, Inc., Kaohsiung (TW)

(72) Inventors: Po-I Wu, Kaohsiung (TW); Jung Jui Kang, Kaohsiung (TW); Chang Chi Lee, Kaohsiung (TW); Pao-Nan Lee, Kaohsiung (TW); Ming-Fong Jhong, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 953 days.

(21) Appl. No.: 17/886,254

(22) Filed: Aug. 11, 2022

(65) Prior Publication Data

US 2024/0055365 A1     Feb. 15, 2024

(51) Int. Cl.
H10W 42/20      (2026.01)
H10W 20/20      (2026.01)
H10W 44/20      (2026.01)
H10W 90/00      (2026.01)

(52) U.S. Cl.
CPC ........... H10W 42/20 (2026.01); H10W 20/20 (2026.01); H10W 44/20 (2026.01); H10W 44/209 (2026.01)

(58) Field of Classification Search
CPC ... H10W 20/20; H10W 20/43; H10W 20/427; H10W 44/20; H10W 44/209; H10W 70/614; H10W 90/701; H10W 90/00;

H01L 23/552; H01L 23/481; H01L 23/66; H01L 2223/6616; H01L 23/49816; H01L 25/18; H01L 23/5286; H01L 23/5389; H01L 25/0655
See application file for complete search history.

(56) References Cited

U.S. PATENT DOCUMENTS

| | | | | |
|---|---|---|---|---|
| 9,147,643 | B2 * | 9/2015 | You | H01L 23/481 |
| 9,659,852 | B2 * | 5/2017 | Kim | H01L 24/17 |
| 11,004,783 | B2 | 5/2021 | Calugaru | |
| 11,056,459 | B2 * | 7/2021 | Tung | H01L 21/6836 |
| 2017/0200702 | A1 * | 7/2017 | Hung | H01L 25/50 |
| 2020/0227385 | A1 * | 7/2020 | Hiner | H01L 23/3128 |
| 2020/0286871 | A1 * | 9/2020 | Liff | H01L 21/4853 |
| 2021/0183773 | A1 * | 6/2021 | Rubin | H01L 24/17 |
| 2021/0193616 | A1 * | 6/2021 | Cheah | H01L 23/13 |

(Continued)

*Primary Examiner* — Dale E Page
*Assistant Examiner* — Cristian A Tivarus
(74) *Attorney, Agent, or Firm* — Foley and Lardner LLP

(57) ABSTRACT

An electronic device is disclosed. The electronic device includes a first interconnection structure, and a first electronic component disposed over the first interconnection structure and having an active surface and a lateral surface. The electronic device also includes a power connection disposed between the first interconnection structure and the active surface of the first electronic component, and a first non-power connection extending along the lateral surface of the first electronic component and electrically connected to the first interconnection structure. The electronic device also includes a second non-power connection disposed between the first interconnection structure and the active surface of the first electronic component. The second non-power connection is configured to block an electromagnetic interference (EMI) between the power connection and the first non-power connection.

7 Claims, 9 Drawing Sheets

(56) References Cited

U.S. PATENT DOCUMENTS

2021/0407949 A1 * 12/2021 Park ........................ H01L 24/17
2022/0139880 A1 *  5/2022 Lee ......................... H01L 25/18
257/621

* cited by examiner

ELECTRONIC DEVICE

BACKGROUND

1. Field of the Disclosure

The present disclosure generally relates to an electronic device.

2. Description of the Related Art

An interconnect component (such as a substrate, an interposer and a printed circuit board (PCB)) may bridge components and provide electrical connections among the same. Conventionally, power signals and electrical signals (such as high-speed signals) are transmitted through the same surface (i.e., the active surface) of a component. Therefore, input/output (I/O) pins carrying electrical signals may be occupied and limited. In addition, unwanted noise or interference from the power signals may affect electronic performance of the high-speed circuitry.

SUMMARY

In some embodiments, an electronic device includes a first interconnection structure, and a first electronic component disposed over the first interconnection structure and having an active surface and a lateral surface. The electronic device also includes a power connection disposed between the first interconnection structure and the active surface of the first electronic component, and a first non-power connection extending along the lateral surface of the first electronic component and electrically connected to the first interconnection structure. The electronic device also includes a second non-power connection disposed between the first interconnection structure and the active surface of the first electronic component. The second non-power connection is configured to block an electromagnetic interference (EMI) between the power connection and the first non-power connection.

In some embodiments, an electronic device includes a first interconnection structure including a central region and a periphery region around the central region, and an electronic component disposed over the central region of the first interconnection structure. The electronic device also includes a non-power path disposed over the periphery region of the first interconnection structure, and a first power path disposed over the central region of the first interconnection structure.

In some embodiments, an electronic device includes a first electronic component, a second electronic component disposed adjacent to the first electronic component, and a plurality of first ground vias disposed in the second electronic component. The electronic device also includes a plurality of first power vias disposed in the second electronic component and disposed between the first electronic component and at least one of the plurality of first ground vias.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
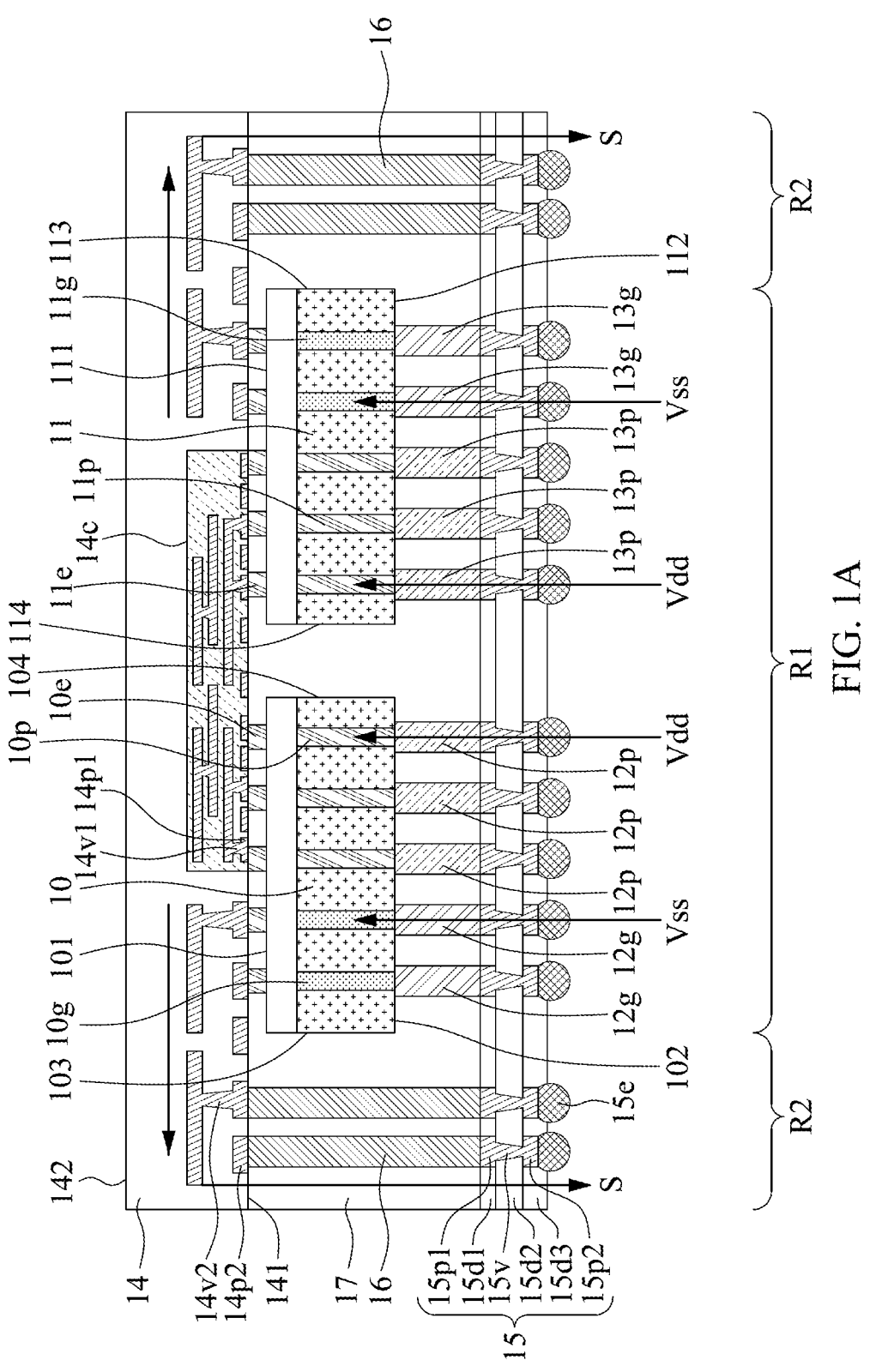
FIG. 1A is a cross-section of an exemplary electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-section of an exemplary electronic device 1 according to some embodiments of the present disclosure. In some embodiments, the electronic device 1 may include a package, such as a semiconductor device package. In some embodiments, the electronic device 1 may include electronic components 10, 11, conductive elements 12p, 12g, 13p, 13g, 16, interconnection structures 14, 15, and an encapsulant 17.

The interconnection structure 15 may include, for example, a printed circuit board (PCB), such as a paper-based copper foil laminate, a composite copper foil laminate, or a polymer-impregnated glass-fiber-based copper foil laminate. In some embodiments, the interconnection structure 15 may include an interposer or include interposer-like wiring to form a structure which may be regarded as an interposer or a fan-out substrate.

In some embodiments, the interconnection structure 15 may include one or more circuit layers or redistribution layers (RDLs). In some embodiments, the interconnection structure 15 may include conductive pads 15$p$1, 15$p$2, conductive vias 15$v$, and dielectric layers 15$d$1, 15$d$2, 15$d$3. The conductive pads 15$p$1 may be in proximity to, adjacent to, or embedded in and exposed by a surface of the interconnection structure 15. The conductive pads 15$p$1 may be coplanar with a surface of the interconnection structure 15. The conductive pads 15$p$1 may be partially covered by the dielectric layer 15$d$1. The conductive pads 15$p$1 may be partially exposed by the dielectric layer 15$d$1 to contact the conductive elements 12$p$, 12$g$, 13$p$, 13$g$ and 16.

The conductive vias 15$v$ may penetrate the dielectric layer 15$d$2. The conductive vias 15$v$ may each be electrically connected between one of the conductive pads 15$p$1 and one of the conductive pads 15$p$2. The conductive vias 15$v$ may each taper toward a corresponding one of the conductive pads 15$p$2. The conductive vias 15$v$ may each taper outwardly. However, in some other embodiments, the conductive vias 15$v$ may each taper toward the corresponding one of the conductive pads 15$p$1. For example, the conductive vias 15$v$ may each taper inwardly.

The conductive pads 15$p$2 may be in proximity to, adjacent to, or embedded in and exposed by a surface of the interconnection structure 15. The conductive pads 15$p$2 may be non-coplanar with a surface of the interconnection structure 15. The conductive pads 15$p$2 may be recessed from a surface of the interconnection structure 15. The conductive pads 15$p$2 may be partially covered by the dielectric layer 15$d$3. The conductive pads 15$p$2 may be partially exposed by the dielectric layer 15$d$3.

One or more electrical contacts 15$e$ may be disposed under the interconnection structure 15. For example, the electrical contacts 15$e$ may be disposed on or over the conductive pads 15$p$2 and can provide electrical connections between the electronic device 1 and an external device, such as a carrier, a printed circuit board (PCB), or a motherboard (not illustrated in the figures). In some embodiments, the electrical contacts 15$e$ may include solder balls or solder bumps, such as a controlled collapse chip connection (C4) bump, a ball grid array (BGA) or a land grid array (LGA).

In some embodiments, a corresponding one of the conductive pads 15$p$1, a corresponding one of the conductive vias 15$v$, a corresponding one of the conductive pads 15$p$2, and a corresponding one of the electrical contacts 15$e$ may be aligned. For example, a corresponding one of the conductive pads 15$p$1, a corresponding one of the conductive vias 15$v$, a corresponding one of the conductive pads 15$p$2, and a corresponding one of the electrical contacts 15$e$ may at least partially overlap. For example, the interconnection structure 15 may be configured to provide vertical electrical connections between the electronic device 1 and an external device (such as a carrier, a PCB, or a motherboard).

In some embodiments, when the electronic device 1 is mounted on an external device through the electrical contacts 15$e$, the interconnection structure 15 may be closer to the external device than the interconnection structure 14. The external device may provide power and/or ground connections to the electronic component 10 and the electronic component 11. For example, the external device may have a connector or terminal configured to be electrically connected to a power source or a power supply (not illustrated in the figures). A power signal (or abbreviated as "a power") from the power source may be transmitted to the electronic component 10 (or the electronic component 11) through the external device and the interconnection structure 15.

The interconnection structure 15 may include a region R1 (such as a central region) and a region R2 (such as a periphery) around the region R1. It is noted that the regions R1 and R2 may not have visible or observable boundaries. The region R1 may abut or connect with the region R2. In other embodiments, the region R1 may be laterally spaced apart from the region R2 by a gap or a distance. The regions R1 and R2 may include or encompass imaginary surface regions or imaginary sections of the interconnection structure 15.

The electronic component 10 and the electronic component 11 may be disposed over the region R1 of the interconnection structure 15. The electronic components 10 and 11 may each include an active device or an active component. In some embodiments, the electronic components 10 and 11 may each be or include circuits or circuit elements that rely on an external power supply to control or modify electrical signals.

The electronic component 10 may include a surface 101 facing the interconnection structure 14, a surface 102 (which is opposite to the surface 101) facing the interconnection structure 15, and surfaces 103, 104 (which may also be referred to as lateral surfaces) extending between the surface 101 and the surface 102. The surface 101 may include an active surface and the surface 102 may include a backside surface or a rear surface.

The electronic component 10 may include one or more electrical contacts 10$e$ on the surface 101. The electronic component 10 may electrically connect with the interconnection structure 14 through the electrical contacts 10$e$. The electronic component 10 and the electronic component 11 may be electrically connected or communicate with each other through the interconnection structure 14. The electrical contacts 10$e$ may include conductive pads. In some embodiments, the electrical connection between the electronic component 10 and the interconnection structure 14 may be obtained by solder bonding, Cu-to-Cu bonding, or hybrid bonding.

In addition, the electronic component 10 may include one or more conductive vias 10$p$ and 10$g$. In some embodiments, the conductive vias 10$p$ and 10$g$ may partially penetrate the electronic component 10. The conductive vias 10$p$ and 10$g$ may each be at least partially exposed by the backside surface (such as the surface 102) of the electronic component 10.

Similar to the electronic component 10, the electronic component 11 may include a surface 111 facing the interconnection structure 14, a surface 112 (which is opposite to the surface 101) facing the interconnection structure 15, and surfaces 113, 114 (which may also be referred to as lateral surfaces) extending between the surface 111 and the surface 112. The surface 111 may include an active surface and the surface 112 may include a backside surface or a rear surface.

The electronic component 11 may electrically connect with the interconnection structure 14 through electrical contacts 11$e$. The electrical contacts 11$e$ may include conductive pads. In some embodiments, the electrical connection between the electronic component 11 and the interconnection structure 14 may be obtained by solder bonding, Cu-to-Cu bonding, or hybrid bonding.

In addition, the electronic component 11 may include one or more conductive vias 11$p$ and 11$g$. In some embodiments, the conductive vias 11$p$ and 11$g$ may partially penetrate the electronic component 11. The conductive vias 11$p$ and 11$g$ may each be at least partially exposed by the backside surface (such as the surface 112) of the electronic component 11.

The electronic component 10 and the electronic component 11 may be disposed side-by-side. For example, the surface 104 of the electronic component 10 may face the surface 114 of the electronic component 11.

In some embodiments, the electronic components 10 and 11 may each include a processor, a controller, a memory, or an input/output (I/O) buffer, etc. For example, the electronic component 10 may include a central processing unit (CPU), a microprocessor unit (MPU), a graphics processing unit (GPU), a microcontroller unit (MCU), an application-specific integrated circuit (ASIC), a field-programmable gate array (FPGA), or other types of integrated circuits (ICs). For example, the electronic components 10 and 11 may each include a non-volatile memory (such as a flash memory and a read-only memory (ROM)) or a volatile memory (such as a Dynamic Random Access Memory (DRAM)). For example, the electronic components 10 and 11 may each include a high bandwidth memory (HBM).

The positions and number of the electronic components in the electronic device 1 are not intended to limit the present disclosure. For example, there may be any number of electronic components in the electronic device 1 due to design requirements.

The conductive elements $12p$ and $12g$ may be disposed on or over the region R1 of the interconnection structure 15. The conductive elements $12p$ and $12g$ may be disposed between the interconnection structure 15 and the surface 102 of the electronic component 10. The conductive elements $12p$ may each be electrically connected to a corresponding one of the conductive vias $10p$ and a corresponding one of the conductive pads $15p1$. The conductive elements $12g$ may each electrically connect with a corresponding one of the conductive vias $10g$ and a corresponding one of the conductive pads $15p1$.

In some embodiments, the interconnection structure 15, the conductive elements $12p$, and the conductive vias $10p$ may be configured to provide, define, construct, or establish one or more power paths (or power routing paths) for the electronic component 10. For example, the electronic component 10 may be electrically connected to a power supply through the interconnection structure 15 and the conductive elements $12p$. The conductive vias $10p$ may be configured to receive power from the conductive elements $12p$. The conductive elements $12p$ and the conductive vias $10p$ may be collectively referred to as a power connection.

In some embodiments, the interconnection structure 15, the conductive elements $12g$, and the conductive vias $10g$ may be configured to provide, define, construct, or establish one or more ground paths for the electronic component 10. For example, the electronic component 10 may electrically connect with a ground through the interconnection structure 15 and the conductive elements $12g$. The conductive vias $10g$ may be configured to be grounded. The conductive elements $12g$ and the conductive vias $10g$ may be collectively referred to as a non-power connection or a ground connection.

With respect to the interconnection structure 15 (or the power supply), the non-power path (such as the signal path) of the electronic component 10 may be disposed behind the power path. For example, conductive vias $10p$ (which are power inputs or portions for receiving power) may be closer to the interconnection structure 15 (and also the power supply) than the electrical contacts $10e$ (which are portions for transmitting and/or receiving non-power signals).

The conductive elements $13p$ and $13g$ may be disposed on or over the region R1 of the interconnection structure 15. The conductive elements $13p$ and $13g$ may be disposed between the interconnection structure 15 and the surface 112 of the electronic component 11. The conductive elements $13p$ may each be electrically connected to a corresponding one of the conductive vias $11p$ and a corresponding one of the conductive pads $15p1$. The conductive elements $13g$ may each be electrically connected to a corresponding one of the conductive vias $11g$ and a corresponding one of the conductive pads $15p1$.

In some embodiments, the interconnection structure 15, the conductive elements $13p$, and the conductive vias $11p$ may be configured to provide, define, construct, or establish one or more power paths for the electronic component 11. For example, the electronic component 11 may electrically connect with a power supply through the interconnection structure 15 and the conductive elements $13p$. The conductive vias $11p$ of the electronic component 11 may be configured to receive a power from the conductive elements $13p$. The conductive elements $13p$ and the conductive vias $11p$ may be collectively referred to as a power connection.

In some embodiments, the interconnection structure 15, the conductive elements $13g$, and the conductive vias $11g$ may be configured to provide, define, construct, or establish one or more ground paths for the electronic component 11. For example, the electronic component 11 may electrically connect with a ground through the interconnection structure 15 and the conductive elements $13g$. The conductive vias $11g$ may be configured to be grounded. The conductive elements $13g$ and the conductive vias $11g$ may be collectively referred to as a non-power connection or a ground connection.

With respect to the interconnection structure 15 (or the power supply), the non-power path (such as the signal path) of the electronic component 11 may be disposed behind the power path. For example, conductive vias $11p$ (which are power inputs or portions for receiving power) may be closer to the interconnection structure 15 (and also the power supply) than the electrical contacts $11e$ (which are portions for transmitting and/or receiving non-power signals).

As used herein, a power path may refer to a path dedicated to power supply connections. For example, the conductive elements $12p$ and $13p$ may electrically couple to a power voltage "Vdd." In some embodiments, the conductive vias $10p$ and $11p$ connected to the conductive elements $12p$ and $13p$ may include power vias configured to electrically couple to the power voltage Vdd. In some embodiments, the power voltage Vdd may include a positive power voltage.

A non-power path may refer to a path through which a non-power signal may be transmitted. A non-power path may include a signal path for transmitting analog signals, digital signals, clock signals or other electrical signals. A non-power path may include a ground path for transmitting a negative power voltage or ground voltage. For example, the conductive elements $12g$ and $13g$ may electrically couple to a reference voltage ("Vss"). In some embodiments, the reference voltage Vss may include a negative power voltage or ground voltage.

In some embodiments, the conductive vias $10g$ and $11g$ connected with the conductive elements $12g$ and $13g$ may include ground vias configured to electrically couple to the reference voltage Vss.

In some embodiments, the electronic components 10 and 11 may each include different regions configured to perform different functions, receive different types of power control, and/or receive different power voltages.

For example, different voltages may be provided to regions of different functions of the electronic component 10. For example, a power of a first voltage may be provided to one of the conductive vias 10$p$ and a power of a second voltage different from the first voltage may be provided to another one of the conductive vias 10$p$.

For example, different voltages may be provided to regions of different functions of the electronic component 11. For example, a power of a first voltage may be provided to one of the conductive vias 11$p$ and a power of a second voltage different from the first voltage may be provided to another one of the conductive vias 11$p$.

The interconnection structure 14 may be disposed over the electronic component 10 and the electronic component 11. The interconnection structure 14 may be disposed adjacent to the surface 101 of the electronic component 10 and the surface 111 of the electronic component 11.

The interconnection structure 14 may include, for example, a substrate, a PCB (such as a paper-based copper foil laminate, a composite copper foil laminate, or a polymer-impregnated glass-fiber-based copper foil laminate), an interposer, a bridge component, an interconnect component, etc. The interconnection structure 14 may be configured for data transmissions between the electronic component 10 and the electronic component 11.

The interconnection structure 14 may include a surface 141 facing the electronic component 10 and the electronic component 11 and a surface 142 opposite to the surface 141.

In some embodiments, the interconnection structure 14 may include one or more circuit layers or RDLs. The interconnection structure 14 may include conductive pads 14$p$1 and 14$p$2 in proximity to, adjacent to, or embedded in and exposed by the surface 141 of the interconnection structure 14. The interconnection structure 14 may include conductive vias 14$v$1 and 14$v$2 connecting the conductive pads 14$p$1 and 14$p$2 to the internal conductive layers for providing one or more fan-out horizontal non-power paths (or non-power routing paths).

The conductive vias 14$v$1 and 14$v$2 may each taper from the surface 141 toward the surface 142. In some other embodiments, the conductive vias 14$v$1 and 14$v$2 may each taper from the surface 142 toward the surface 141.

In some embodiments, the interconnection structure 14 may include regions or portions having different circuit densities, such as different numbers of components, I/O pins and/or wirings per unit area. For example, the interconnection structure 14 may include a high-density circuit region and a low-density circuit region, among other circuit regions.

For example, the interconnection structure 14 may include a circuit region 14$c$ having a circuit density relatively higher than that of the other circuit regions of the interconnection structure 14. For example, the line width, the line spacing and/or the pad pitch in the circuit region 14$c$ may be relatively narrower than that of the other circuit regions of the interconnection structure 14. For example, the pad pitch of the conductive pads 14$p$1 may be relatively narrower than the pad pitch of the conductive pads 14$p$2. For example, the line/space of the circuit region 14$c$ may be about 10 μm/10 μm or less, such as 5um/5um or 2 μm/2 μm. In some embodiments, the circuit region 14$c$ may include a bride die incorporated into the interconnection structure 14.

In some embodiments, the high-density circuit region (such as the circuit region 14$c$) of the interconnection structure 14 may be configured to provide, define, construct, or establish a non-power path between the electronic component 10 and the electronic component 11.

The low-density circuit region (such as the circuit region around the circuit region 14$c$) of the interconnection structure 14 may be configured to provide, define, construct, or establish a non-power path (such as a signal path) between the electronic component 10 and the conductive elements 16 and a non-power path (such as a signal path) between the electronic component 11 and the conductive elements 16. The conductive elements 16 may connect the low-density circuit region to the periphery (such as the regions R2) of the interconnection structure 15.

As stated, a non-power path may include a signal path for transmitting analog signals, digital signals, clock signals or other electrical signals. For example, as illustrated in FIG. 1A, a non-power signal "S" may be transmitted through the interconnection structure 14, the conductive elements 16, and the regions R2 of the interconnection structure 15. The non-power signal S may include analog signals, digital signals, clock signals or other electrical signals.

The conductive elements 16 may be disposed next to the electronic component 10 and the electronic component 11. The conductive elements 16 may be disposed around the electronic component 10 and the electronic component 11. For example, the conductive elements 16 may extend along the surface 103 of the electronic component 10. For example, the conductive elements 16 may extend along the surface 113 of the electronic component 11. The conductive elements 16 may extend from an elevation lower than the surface 102 toward an elevation higher than the surface 101. The conductive elements 16 may extend from an elevation lower than the surface 112 toward an elevation higher than the surface 111.

The conductive elements 16 may be disposed on or over the region R2 of the interconnection structure 15. The conductive elements 16 may be electrically connected between the interconnection structure 15 and the interconnection structure 14. The conductive elements 16 may each electrically connect to a corresponding one of the conductive pads 14$p$2 and the conductive pads 15$p$1.

The conductive elements 16 may be configured to provide, define, construct, or establish a non-power path (such as a signal path) between the interconnection structure 15 and the interconnection structure 14. In some embodiments, the conductive elements 16 may be configured to receive a non-power signal from the electronic component 10 through the interconnection structure 14. Similarly, the conductive elements 16 may be configured to receive a non-power signal from the electronic component 11 through the interconnection structure 14.

In some embodiments, the non-power path (such as the signal path) for transmitting the non-power signal S may extend along the surface 103 of the electronic component 10. The non-power path (such as the ground path) for transmitting the reference voltage Vss may be disposed between the non-power path for transmitting the non-power signal S and the power path for transmitting the power voltage Vdd.

The non-power path (such as the signal path) for transmitting the non-power signal S may be closer to the outmost lateral surface of the electronic device 1 than the non-power path (such as the ground path) for transmitting the reference voltage Vss. The non-power path (such as the signal path) for transmitting the non-power signal S may be closer to the outmost lateral surface of the electronic device 1 than the power path for transmitting the power voltage Vdd. The non-power path (such as the ground path) for transmitting the reference voltage Vss may be closer to the outmost lateral surface of the electronic device 1 than the power path for transmitting the power voltage Vdd.

In some embodiments, the conductive elements 12g and 13g may be configured to function as a shielding structure. For example, the conductive elements 12g and 13g may be configured to provide electromagnetic interference (EMI) protection to protect the conductive elements 12p and 13p from interference (such as noise or interference generated from EMI field) by the conductive elements 16, and vice versa. In some embodiments, the conductive elements 12g and 13g may be configured to provide EMI protection to protect the conductive elements 12p and 13p from interference external to the electronic device 1, and vice versa.

In some embodiments, the conductive elements 12p, 12g, 13p, 13g, and 16 may each include a connection or a link configured to electrically couple one electronic component to another electronic component. In some embodiments, the conductive elements 12p, 12g, 13p, 13g, and 16 may each include a conductive pillar, a conductive via (such as a through-silicon via (TSV)), a conductive trace, a conductive wire, or other feasible connectors. In some embodiments, the conductive elements 12p, 12g, 13p, 13g, and 16 may each include conductive materials, such as copper (Cu), tin (Sn), aluminum (Al), gold (Au), silver (Ag), tungsten (W), nickel (Ni), or other suitable materials.

The encapsulant 17 may be disposed over the interconnection structure 15. The encapsulant 17 may be disposed between the interconnection structure 15 and the interconnection structure 14. The encapsulant 17 may cover, encapsulate or surround the electronic components 10 and 11 and conductive elements 12p, 12g, 13p, 13g, and 16.

In some embodiments, the encapsulant 17 may include an epoxy resin having fillers, a molding compound (e.g., an epoxy molding compound or another molding compound), a polyimide, a phenolic compound or material, a material with a silicone dispersed therein, or a combination thereof.

According to some embodiments of the present disclosure, by arranging an power input on the backside surface of the electronic component and closer to a power source than the non-power path of the electronic component, the interference issue (such as noise or interference generated from the EM field) between the power path and the non-power path can be resolved or alleviated.

For example, conductive vias 10p (which are power inputs or portions for receiving power) may be closer to the interconnection structure 15 (and also the power supply) than the electrical contacts 10e (which are portions for transmitting and/or receiving non-power signals). A distance may be provided between the power inputs on the backside surface (such as the surface 102) and the electrical contacts 10e to minimize influence from the EM field. In addition, as stated, using the conductive elements 12g and 13g as a shielding structure may also help resolve or alleviate the interference issue. In some embodiments, the conductive elements 12g and 13g may be formed together with the conductive elements 12p and 13p to eliminate the need for additional separate shielding layers.

In addition, since the electronic device 1 can be mounted on a carrier and directly receive power through the interconnection structure 15, the power input can be brought closer to the power source. Therefore, the length of the power path is shorter and the power transmission efficiency can be improved. In some embodiments, the power voltage Vdd may be transmitted vertically to support high power or high voltage electronic components, such as a high-speed CPU and/or an HBM.

Furthermore, the electrical contacts 15e for carrying power signals may be arranged in the region R1 (such as the central region) of the interconnection structure 15 and the electrical contacts 15e for carrying non-power signals may be arranged in the region R2 (such as the periphery) of the interconnection structure 15. The locations and number of the electrical contacts 15e may be designed based on different routing requirements, which allow the electronic device 1 to be easily modified and mounted on different carriers.

Figure 1B:
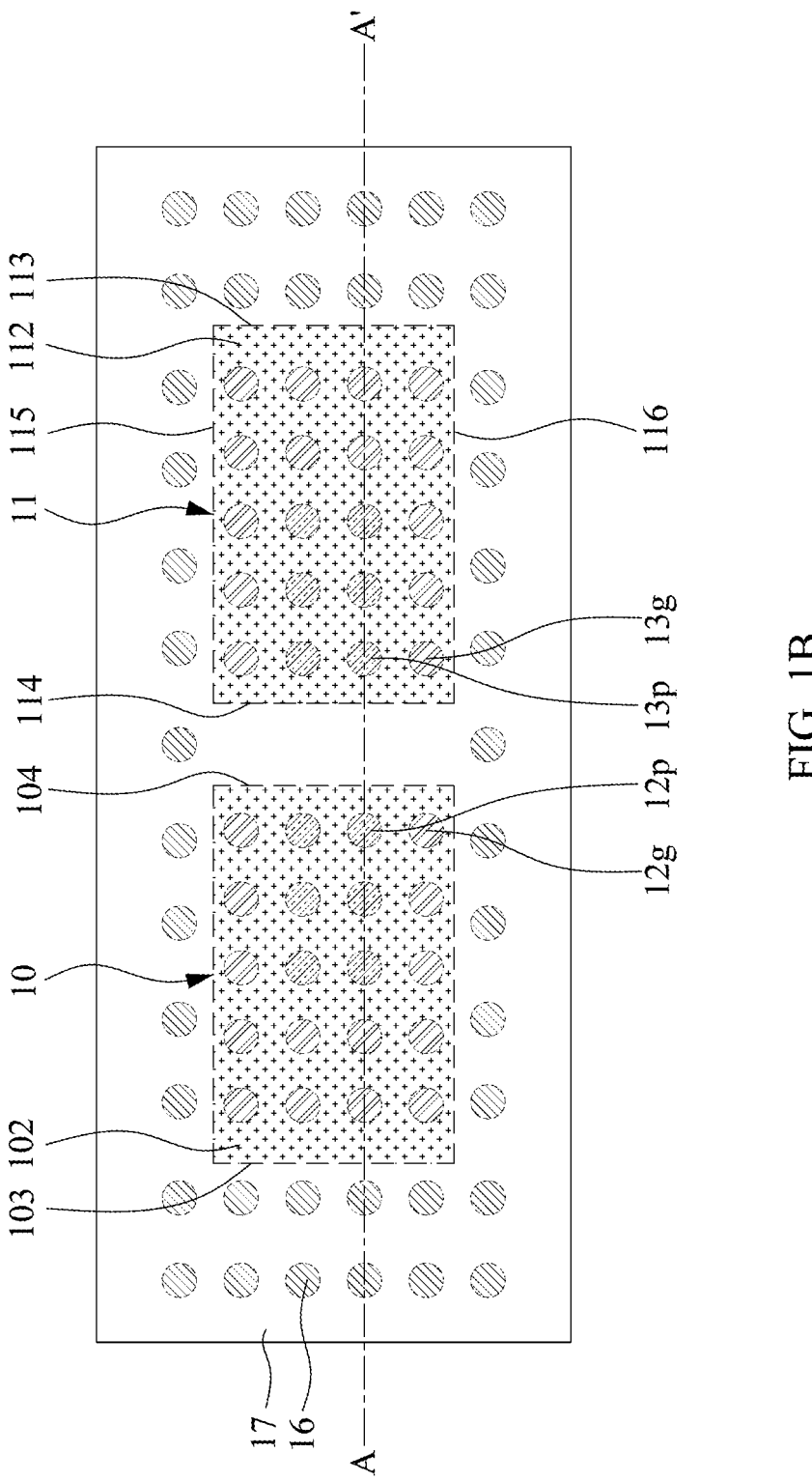
FIG. 1B is an underside view of an exemplary electronic device according to some embodiments of the present disclosure.

FIG. 1B is an underside view of an exemplary electronic device 1 according to some embodiments of the present disclosure. In some embodiments, the electronic device 1 in FIG. 1A may have an underside view as shown in FIG. 1B. In some embodiments, the electronic device 1 in FIG. 1B along the line A-A' may have a cross-section as shown in FIG. 1A.

The conductive elements 16 may be disposed around the electronic components 10 and 11. The conductive elements 16 may be disposed around the conductive elements 12g and 13g. The conductive elements 16 may be disposed around the conductive elements 12p and 13p. The conductive elements 12g and 13g may be disposed around the conductive elements 12p and 13p.

The conductive elements 12p and 13p may be brought together and arranged on the central portion from the underside view. The conductive elements 12p may be disposed in (or gathered into) an area between the conductive elements 12g and the surface 104 of the electronic component 10 facing the electronic component 11. The conductive elements 13p may be disposed in (or gathered into) an area between the conductive elements 13g and the surface 114 of the electronic component 11 facing the electronic component 10.

For example, the electronic component 11 may have surfaces (or lateral surfaces) 113, 114, 115, and 116. The surface 113 may be opposite to the surface 114. The surface 115 may be opposite to the surface 116. The surface 115 may be adjacent to the surfaces 113 and 114. The surface 116 may be adjacent to the surfaces 113 and 114.

The conductive elements 13p may be disposed between the surface 114 and at least one of the conductive elements 13g. Another one of the conductive elements 13g may be disposed between the surface 115 and the conductive elements 13p. Yet another one of the conductive elements 13g may be disposed between the surface 116 and the conductive elements 13p.

In some embodiments, the power vias (such as the conductive vias 11p in FIG. 1A) in the electronic component 11 may be disposed between the surface 114 and at least one of the ground vias (such as the conductive vias 11g in FIG. 1A) in the electronic component 11. Another one of the ground vias may be disposed between the surface 115 and the power vias (such as the conductive vias 11p in FIG. 1A) in the electronic component 11. Yet another one of the ground vias may be disposed between the surface 116 and the power vias (such as the conductive vias 11p in FIG. 1A) in the electronic component 11.

In such arrangements, the signal paths (for transmitting the non-power signal S in FIG. 1A) may be disposed around the electronic components 10 and 11. The ground paths (for electrically coupling to the reference voltage Vss in FIG. 1A) and the power paths (for transmitting the power voltage Vdd in FIG. 1A) may be disposed over the electronic components 10 and 11. The conductive elements 12g and 13g may collectively encircle or surround the conductive elements 12p and 13p. The conductive elements 12g and 13g may collectively construct a shielding structure around the conductive elements 12p and 13p. The conductive elements 12g and 13g may be disposed between the signal paths (for transmitting the non-power signal S in FIG. 1A) and the power paths (for transmitting the power voltage Vdd in FIG. 1A).

Figure 1C:
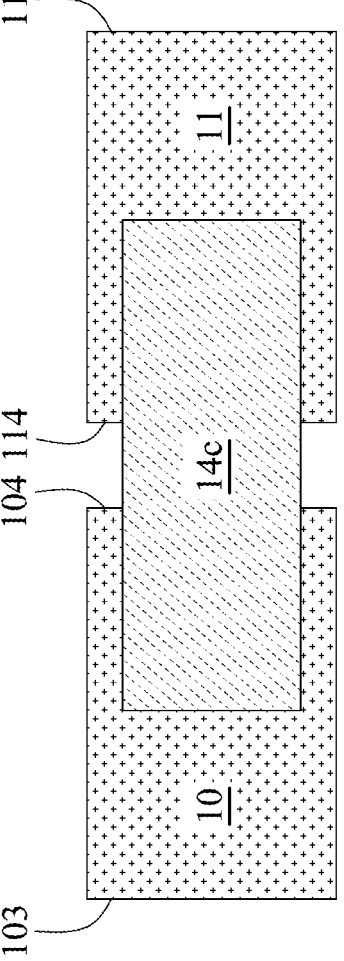
FIG. 1C is a top view of an exemplary electronic device according to some embodiments of the present disclosure.

FIG. 1C is a top view of an exemplary electronic device 1 according to some embodiments of the present disclosure.

The circuit region 14c may overlap with the electronic component 10 and the electronic component 11. The circuit region 14c may cover the electronic component 10 and the electronic component 11. In some embodiments, the circuit region 14c may be configured to provide, define, construct, or establish a non-power path (or a signal path) between the electronic component 10 and the electronic component 11. In some embodiments, the circuit region 14c may include a bridge die. In some embodiments, as stated, the circuit region 14c having a circuit density relatively higher than that of the other circuit regions of the interconnection structure 14 in FIG. 1A.

In some embodiments, a width of the circuit region 14c may be smaller than a width of the electronic component 10 or a width of the electronic component 11. In some other embodiments, a width of the circuit region 14c may be greater than a width of the electronic component 10 or a width of the electronic component 11. The circuit region 14c with a greater dimension may be able to provide more signal paths for supporting high-speed signals.

Figure 2A:
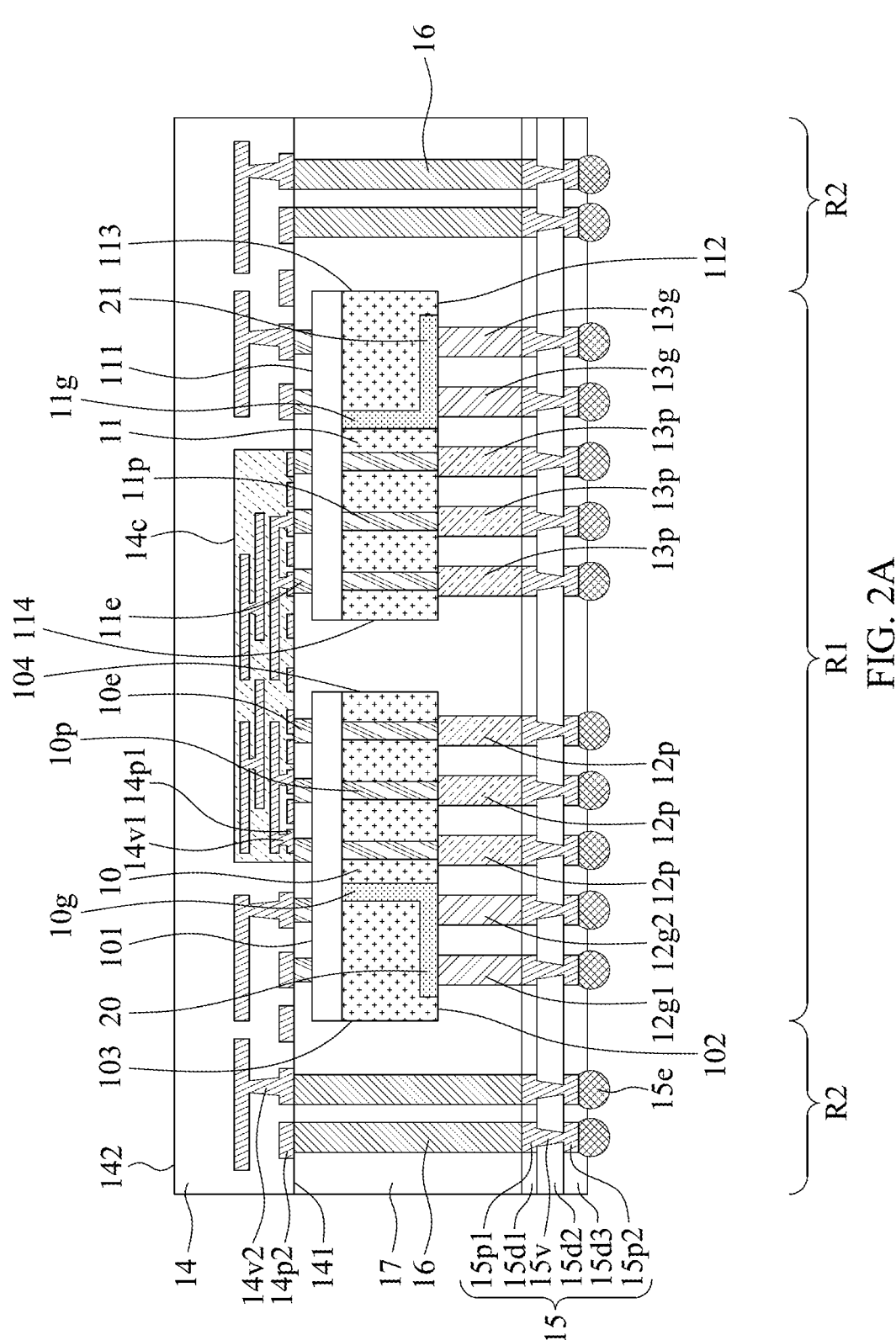
FIG. 2A is a cross-section of an exemplary electronic device according to some embodiments of the present disclosure.

FIG. 2A is a cross-section of an exemplary electronic device 2 according to some embodiments of the present disclosure. The electronic device 2 is similar to the electronic device 1 in FIG. 1A, with differences therebetween as follows.

In FIG. 1A, the conductive vias 10p may each align with a corresponding one of the conductive elements 12p and the conductive vias 10g may each align with a corresponding one of the conductive elements 12g. The conductive vias 11p may each align with a corresponding one of the conductive elements 13p. The conductive vias 11g may each align with a corresponding one of the conductive elements 13g.

In FIG. 2A, conductive elements 12g1 and 12g2 are labelled. The conductive elements 12g1 and 12g2 are similar to the conductive elements 12g except that the conductive elements 12g1 and 12g2 are connected with a conductive layer 20, which connects the conductive elements 12g1 and 12g2 to one of the conductive vias 10g. The conductive layer 20 may be formed in the electronic component 10. The conductive layer 20 may be exposed by the surface 102 of the electronic component 10 to contact the conductive elements 12g1 and 12g2. The conductive elements 12g1 and 12g2 may be arranged on the conductive layer 20. In some other embodiments, the conductive layer 20 may be formed over the surface 102 of the electronic component 10.

Similarly, some of the conductive elements 13g may be connected with a conductive layer 21, which connects the conductive elements 13g to one of the conductive vias 11g. The conductive layer 21 may be formed in the electronic component 11. The conductive layer 21 may be exposed by the surface 112 of the electronic component 11 to contact some of the conductive elements 13g. Some of the conductive elements 13g may be arranged on the conductive layer 21. In some other embodiments, the conductive layer 21 may be formed over the surface 112 of the electronic component 11.

In some embodiments, interference (such as noise or interference generated from the EM field) between the power path and the signal path inside the electronic component 10 may not be as severe as that outside the electronic component 10. Therefore, the conductive elements 12g assigned to the same ground net may be connected by the conductive layer 20 (or a continuous piece of metal).

As such, fewer ground vias are needed (such as fewer conductive vias 10g and 11g) and more space is available for setting or arranging the power vias (such as more conductive vias 10p and 11p). The power transmission efficiency may thus be enhanced and yield increased. In addition, since fewer ground vias are used, the structural strength of the electronic component 10 and the electronic component 11 may be increased.

Figure 2B:
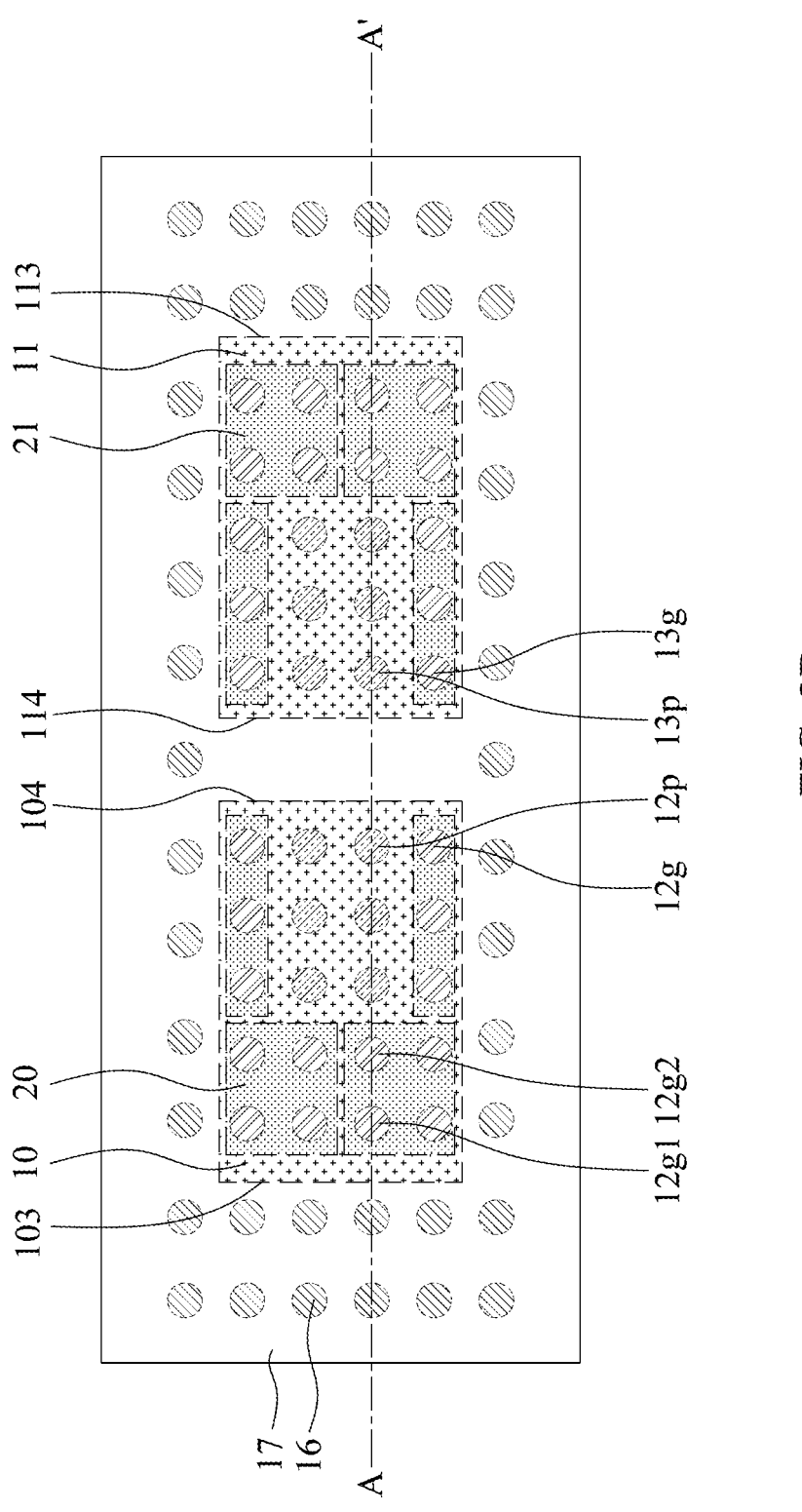
FIG. 2B is an underside view of an exemplary electronic device according to some embodiments of the present disclosure.

FIG. 2B is an underside view of an exemplary electronic device 2 according to some embodiments of the present disclosure. In some embodiments, the electronic device 2 in FIG. 2A may have an underside view as shown in FIG. 2B. In some embodiments, the electronic device 2 in FIG. 2B along the line A-A' may have a cross-section as shown in FIG. 2A.

The conductive elements 12g assigned to the same ground net may be connected by a continuous piece of metal (such as the conductive layer 20). For example, three or four of the conductive elements 12g may be connected by a continuous piece of metal. Each piece of metal may be connected with one of the conductive vias (such as the conductive via 10g in FIG. 2A) in the electronic component 10. Similarly, the conductive elements 13g assigned to the same ground net may be connected by a continuous piece of metal (such as the conductive layer 21).

The positions and number of the continuous pieces of metal recited are not intended to limit the present disclosure. For example, there may be any number of continuous pieces of metal in the electronic component 10 and in the electronic component 11 based on design requirements.

Figure 3A:
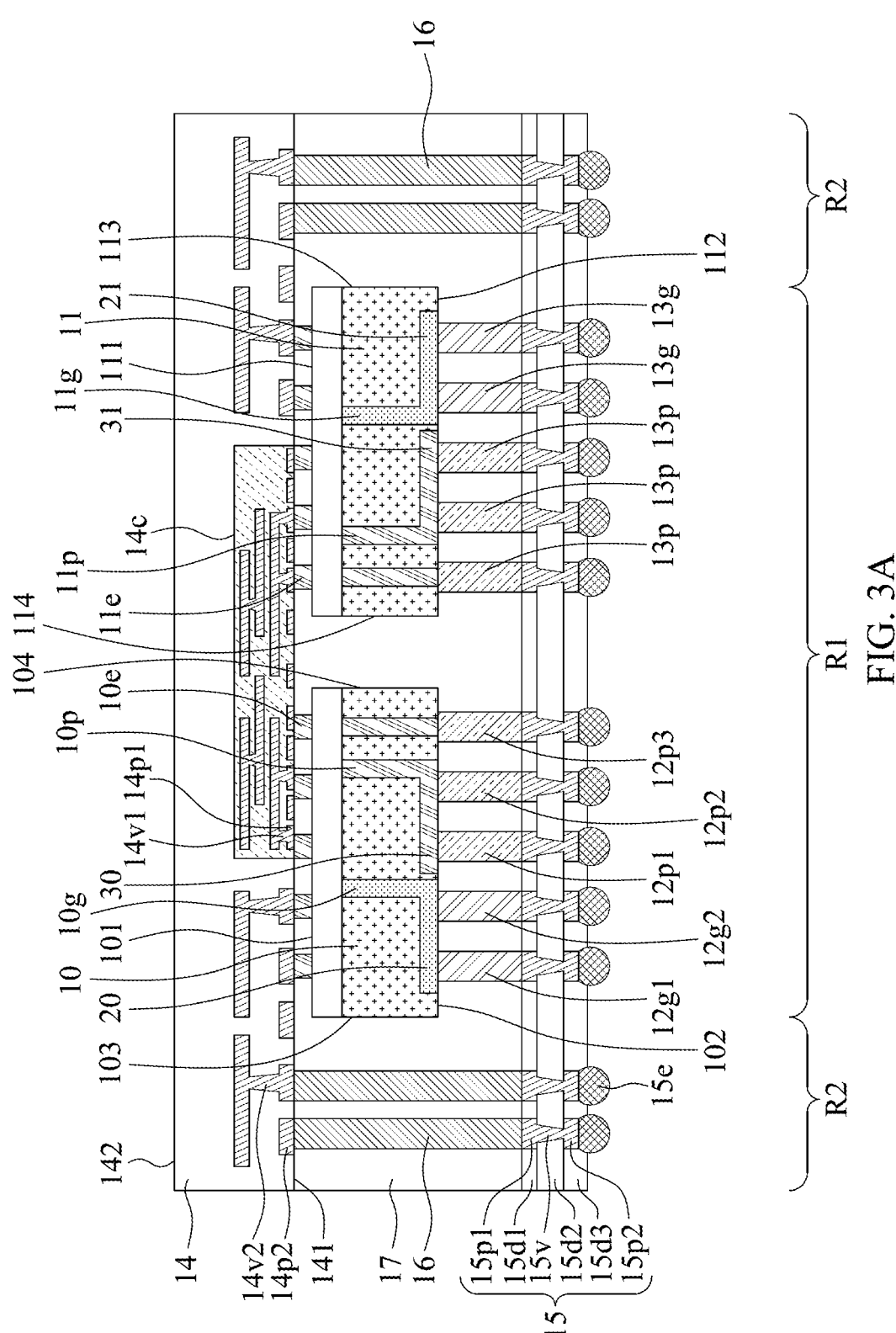
FIG. 3A is a cross-section of an exemplary electronic device according to some embodiments of the present disclosure.

FIG. 3A is a cross-section of an exemplary electronic device 3 according to some embodiments of the present disclosure. The electronic device 3 is similar to the electronic device 2 in FIG. 2A, with differences therebetween as follows.

Conductive elements 12p1, 12p2, and 12p3 are labeled. The conductive elements 12p1, 12p2, and 12p3 are similar to the conductive elements 12p in FIG. 2A. The conductive element 12p3 is connected with one of the conductive vias 10p. The conductive elements 12p1 and 12p2 are connected with a conductive layer 30, which connects the conductive elements 12p to another one of the conductive vias 10p. The conductive layer 30 may be formed in the electronic component 10. The conductive layer 30 may be exposed by the surface 102 of the electronic component 10 to contact the conductive elements 12p1 and 12p2. The conductive elements 12p1 and 12p2 may be arranged on the conductive layer 30. In some other embodiments, the conductive layer 30 may be formed over the surface 102 of the electronic component 10.

In some embodiments, the conductive elements 12p1 and 12p2 assigned to the same power net may be connected by the conductive layer 30 (or a continuous piece of metal). As such, fewer power vias are needed (such as fewer conductive vias 10p). In addition, since fewer power vias are used, the structural strength of the electronic component 10 may be increased.

The conductive layer 30 may connect more than one conductive elements for transmitting power. Power may be converged to power vias connected with the circuit region 14c. More power can be brought to the power vias connected with the circuit region 14c to support high power or high voltage electronic components, such as a high-speed CPU and/or an HBM. In addition, yield can be increased.

Similarly, some of the conductive elements 13$p$ may be connected with a conductive layer 31, which connects the conductive elements 13$p$ to one of the conductive vias 11$p$. The conductive layer 31 may be formed in the electronic component 11. The conductive layer 31 may be exposed by the surface 112 of the electronic component 11 to contact some of the conductive elements 13$p$. Some of the conductive elements 13$p$ may be arranged on the conductive layer 31. In some other embodiments, the conductive layer 31 may be formed over the surface 112 of the electronic component 11.

Figure 3B:
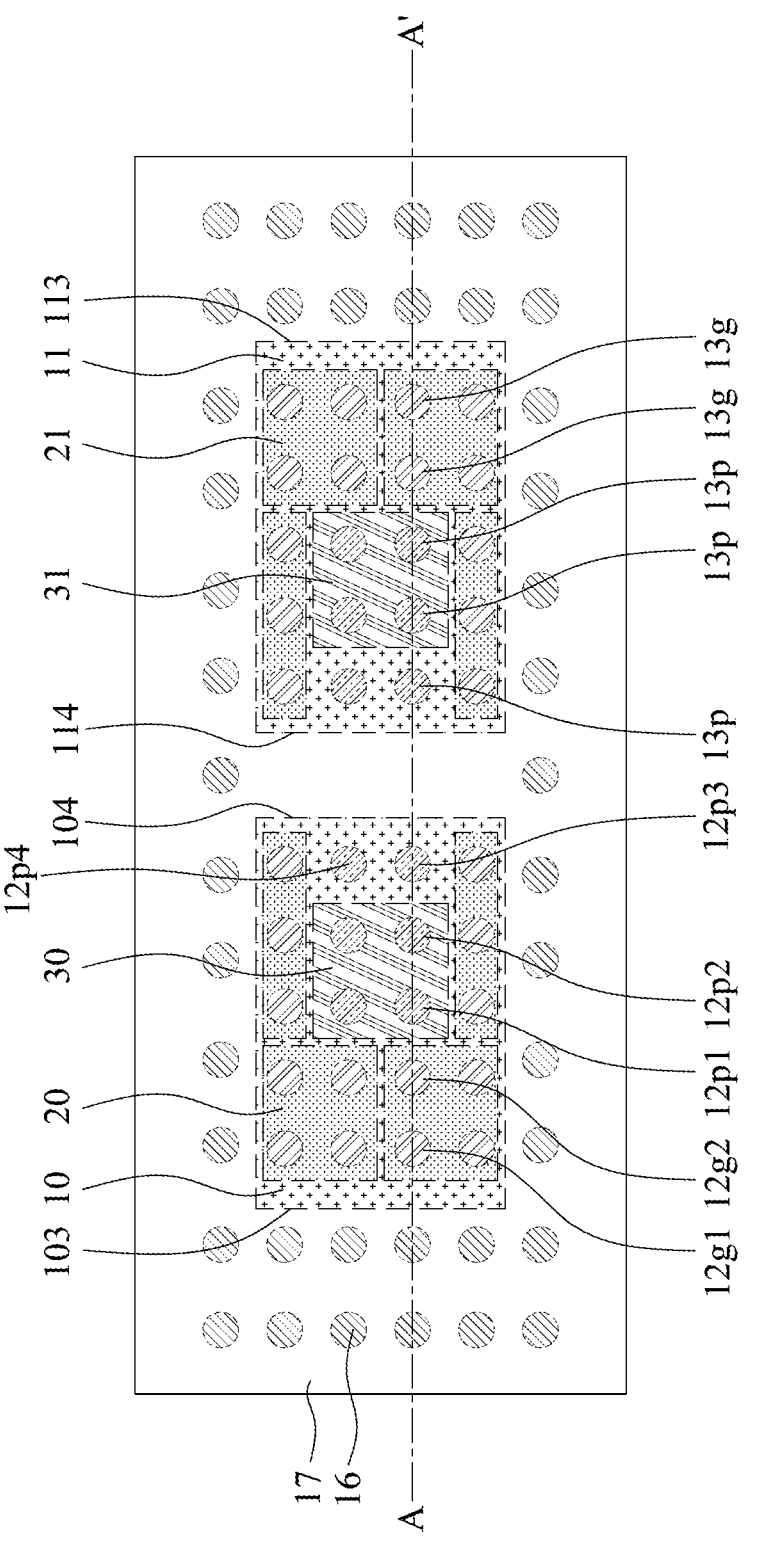
FIG. 3B is an underside view of an exemplary electronic device according to some embodiments of the present disclosure.

FIG. 3B is an underside view of an exemplary electronic device 3 according to some embodiments of the present disclosure. In some embodiments, the electronic device 3 in FIG. 3A may have an underside view as shown in FIG. 3B. In some embodiments, the electronic device 3 in FIG. 3B along the line A-A' may have a cross-section as shown in FIG. 3A.

The conductive elements assigned to the same power net may be connected by a continuous piece of metal (such as the conductive layer 30). For example, four of the conductive elements (including the conductive elements 12$p$1 and 12$p$2) may be connected by the conductive layer 30. The conductive layer 30 may be connected with one of the conductive vias (such as the conductive via 10$v$ in FIG. 2A) in the electronic component 10.

In some embodiments, the conductive elements assigned to different power nets may be configured to transmit different voltages. In some embodiments, the conductive elements assigned to different power nets may connect to regions of different functions of the electronic component 10.

For example, the four of the conductive elements (including the conductive elements 12$p$1 and 12$p$2) may be configured to transmit a power of a first voltage to a first region of the electronic component 10. The conductive element 12$p$3 may be configured to transmit a power of a second voltage to a second region of the electronic component 10. The conductive element 12$p$4 may be configured to transmit a power of a third voltage to a third region of the electronic component 10.

Similarly, the conductive elements 13$p$ assigned to the same power net may be connected by a continuous piece of metal (such as the conductive layer 31). The conductive elements assigned to different power nets may be configured to transmit different voltages to regions of different functions of the electronic component 11.

The positions and number of the continuous pieces of metal recited are not intended to limit the present disclosure. For example, there may be any number of continuous pieces of metal in the electronic component 10 and in the electronic component 11 due to design requirements.

Figure 4:
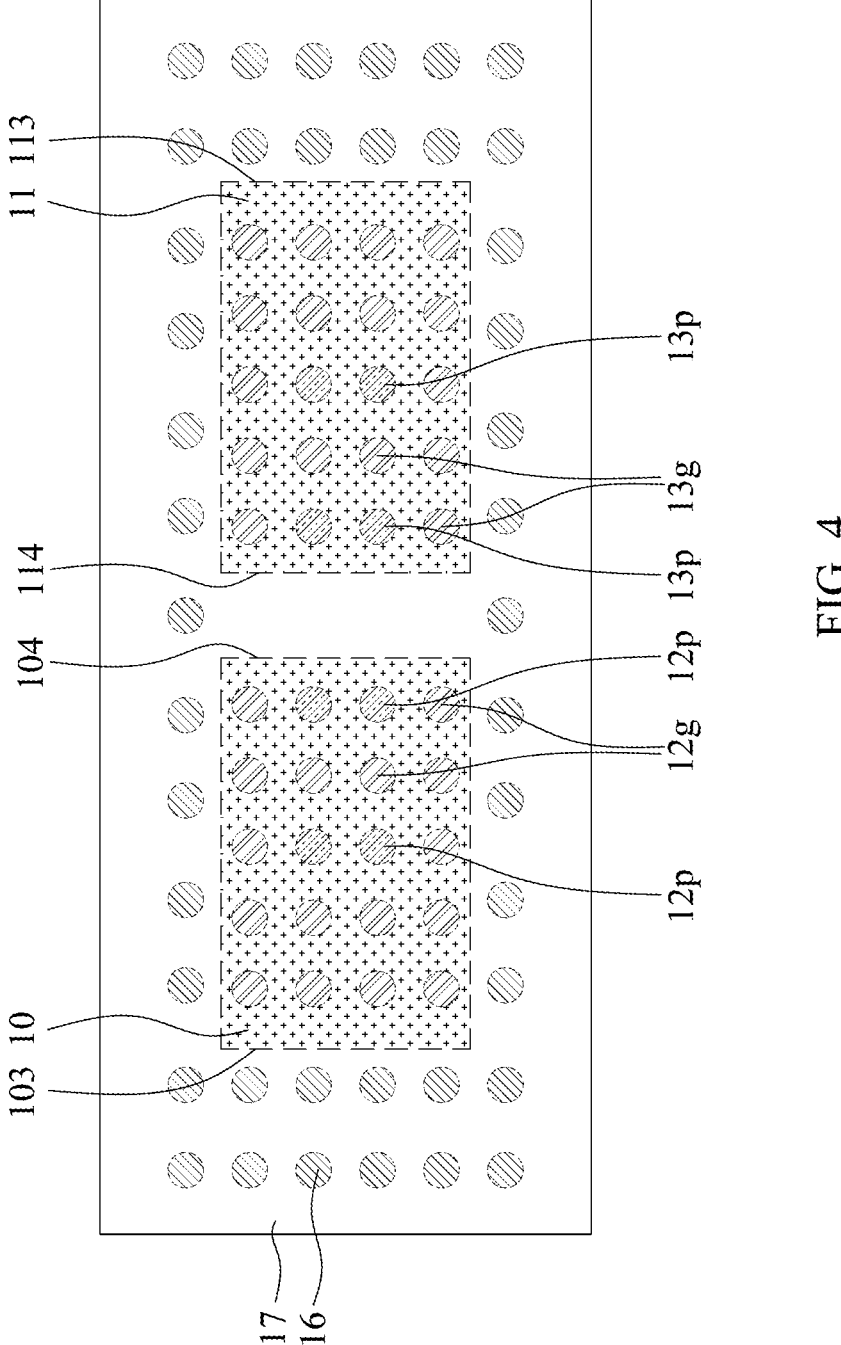
FIG. 4 is an underside view of an exemplary electronic device according to some embodiments of the present disclosure.

FIG. 4 is an underside view of an exemplary electronic device 4 according to some embodiments of the present disclosure. The electronic device 4 is similar to the electronic device 1 in FIG. 1B, with differences therebetween as follows.

In some embodiments, the conductive elements 12$p$ may divided into two groups by the conductive elements 12$g$. One group may be closer to the surface 104 of the electronic component 10 facing the electronic component 11 than to the surface 103. Another group may be arranged on the central portion of the electronic component 10 and surrounded by the conductive elements 12$g$.

In some embodiments, the conductive elements 12$p$ assigned to different power nets may be separated by the conductive elements 12$g$. For example, the group closer to the surface 104 of the electronic component 10 may be assigned to a first power net and the group in the central portion of the electronic component 10 may be assigned to a second power net. The two groups of the conductive elements 12$p$ may be separated by the conductive elements 12$g$. Some of the conductive elements 12$g$ may be disposed between the two groups of the conductive elements 12$p$.

In some embodiments, separating the conductive elements 12$p$ assigned to different power nets by the conductive elements 12$g$ can minimize noise or interference between different power nets. For example, the conductive elements 12$g$ may be configured to provide EMI protection to prevent the conductive elements 12$p$ assigned to different power nets from interfering with each other.

Figure 5:
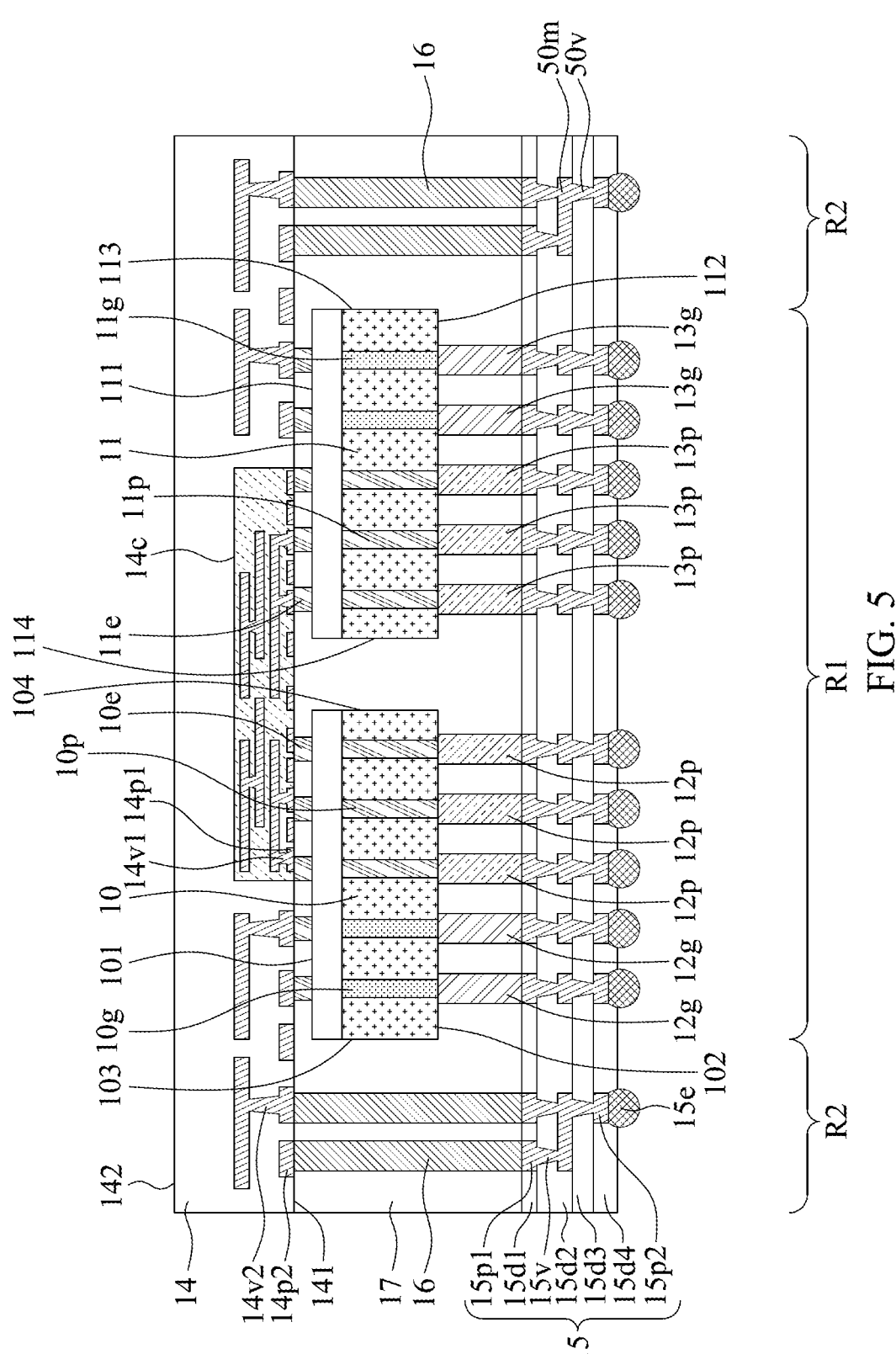
FIG. 5 is a cross-section of an exemplary electronic device according to some embodiments of the present disclosure.

FIG. 5 is a cross-section of an exemplary electronic device 5 according to some embodiments of the present disclosure. The electronic device 5 is similar to the electronic device 1 in FIG. 1A, with differences therebetween as follows.

As stated, the interconnection structure 15 may include one or more circuit layers or RDLs. In some embodiments, the interconnection structure 15 may further include conductive layers 50$m$, conductive vias 50$v$, and a dielectric layer 15$d$4.

The conductive layers 50$m$ may connect the conductive vias 15$v$ to one of the conductive vias 50$v$, which may connect to one of the electrical contacts 15$e$. In some embodiments, based on the routing requirements of the carrier on which the electronic device 5 to be mounted, the circuitry of the interconnection structure 15 and the number of the electrical contacts 15$e$ can be adjusted to match the I/O pads of the carrier.

In some embodiments, the signal paths (for transmitting the non-power signal S in FIG. 1A) may be in the region R2 (such as the periphery) of the interconnection structure 15 and the power paths (for transmitting the power voltage Vdd) may be in the region R1 (such as the central region) of the interconnection structure 15. In some embodiments, the pad pitch in the region R1 may be relatively narrower than the pad pitch in the region R2. For example, the conductive vias 15$v$ in the region R2 may include stacked vias to decrease the voltage drop of the power path and the signal loss.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first interconnection structure;
a first electronic component disposed over the first interconnection structure, wherein a backside surface of the first electronic component facing the first interconnection structure;

a second electronic component disposed over the first interconnection structure, wherein a backside surface of the second electronic component facing the first interconnection structure;
a second interconnection structure disposed over the first electronic component and the second electronic component;
a power connection disposed between the first interconnection structure and an active surface of the first electronic component;
a conductive element extending along a lateral surface of the first electronic component and electrically connected between the first interconnection structure and the second interconnection structure;
a ground connection disposed between the first interconnection structure and the active surface of the first electronic component; and
an encapsulant disposed between the first interconnection structure and the second interconnection structure, wherein the first electronic component includes a plurality of electrical contacts connecting between the active surface of the first electronic component and the second interconnection structure, and the encapsulant covers the plurality of electrical contacts,
wherein the power connection includes a plurality of conductive pillars connecting between the first interconnection structure and the backside surface of the first electronic component, and wherein the plurality of conductive pillars are covered by the encapsulant,
wherein the ground connection is configured to block an electromagnetic interference (EMI) between the power connection and the conductive element, and
wherein the second interconnection structure includes a low-density circuit region and a high-density circuit region embedded in the low-density circuit region, wherein the high-density circuit region electrically connects the first electronic component with the second electronic component, and wherein the low-density circuit region electrically connects the first electronic component with the first interconnection structure,
wherein the power connection includes a first conductive layer disposed adjacent to the backside surface of the first electronic component and connecting a first group of the plurality of conductive pillars to a first through-silicon via (TSV) disposed within the first electronic component, and
wherein the power connection includes a second conductive layer disposed adjacent to the backside surface of the first electronic component and connecting a second group of the plurality of conductive pillars to a second TSV disposed within the first electronic component.

2. The electronic device of claim 1, wherein the power connection includes a plurality of TSVs disposed within the first electronic component, wherein each of the TSVs is aligned with a corresponding one of the plurality of conductive pillars.

3. The electronic device of claim 1, wherein the first group of the plurality of conductive pillars and the second group of the plurality of conductive pillars are assigned to different power nets and are configured to transmit different voltages to regions with different functions of the first electronic component.

4. The electronic device of claim 1, wherein the power connection is overlapped with the high-density circuit region in a direction substantially perpendicular to the active surface of the first electronic component, and the ground connection is non-overlapped with the high-density circuit region in the direction.

5. An electronic device, comprising:

a first electronic component;

a second electronic component disposed adjacent to the first electronic component;

an interconnection structure including a low-density circuit region and a high-density circuit region embedded in the low-density circuit region, wherein the high-density circuit region electrically connects the first electronic component with the second electronic component;

a plurality of first ground vias disposed in the first electronic component; and a plurality of first power vias disposed in the first electronic component and disposed between the second electronic component and at least one of the plurality of first ground vias, wherein the plurality of first power vias are overlapped with the high-density circuit region in a direction substantially perpendicular to an active surface of the first electronic component, and the plurality of first ground vias are non-overlapped with the high-density circuit region in the direction.

6. The electronic device of claim 5, further comprising:

a plurality of conductive pillars disposed over a backside surface of the first electronic component, wherein each of the plurality of first ground vias is aligned with a corresponding one of the plurality of conductive pillars.

7. The electronic device of claim 5, further comprising:

a plurality of non-power connections disposed around the first electronic component and the second electronic component, wherein the low-density circuit region electrically connects the first electronic component with the plurality of non-power connections.

* * * * *